United States Patent
Liu et al.

(10) Patent No.: US 11,594,275 B2
(45) Date of Patent: Feb. 28, 2023

(54) METHOD FOR DETECTING LEAKAGE POSITION IN MEMORY AND DEVICE FOR DETECTING LEAKAGE POSITION IN MEMORY

(71) Applicant: CHANGXIN MEMORY TECHNOLOGIES, INC., Hefei (CN)

(72) Inventors: Xing Liu, Hefei (CN); Xiaodong Luo, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/650,699

(22) Filed: Feb. 11, 2022

(65) Prior Publication Data
US 2023/0010129 A1    Jan. 12, 2023

Related U.S. Application Data (63) Continuation of application No. PCT/CN2021/116960, filed on Sep. 7, 2021.

(30) Foreign Application Priority Data
Jul. 12, 2021    (CN) .......................... 202110785259.1

(51) Int. Cl.
  G11C 29/50   (2006.01)
  G11C 11/4091  (2006.01)
  G11C 11/4094  (2006.01)
  G11C 11/4072  (2006.01)
  G11C 11/4096  (2006.01)

(52) U.S. Cl.
  CPC ...... *G11C 11/4091* (2013.01); *G11C 11/4072* (2013.01); *G11C 11/4094* (2013.01);
  (Continued)

(58) Field of Classification Search
  CPC ........... G11C 11/4091; G11C 11/4072; G11C 11/4094; G11C 11/4096; G11C 29/50016
  See application file for complete search history.

(56) References Cited

U.S. PATENT DOCUMENTS 5,901,096 A * 5/1999 Inokuchi ................ G11C 29/02
                                                 365/201
6,167,541 A * 12/2000 Siek ....................... G11C 29/02
                                                 714/719
(Continued)

FOREIGN PATENT DOCUMENTS

CN    100501876 C   6/2009
CN    111161785 A   5/2020
(Continued)

OTHER PUBLICATIONS

International Search Report and English Translation cited in PCT/CN2021/116960 dated Apr. 13, 2022, 9 pages.
(Continued)

*Primary Examiner* — Mushfique Siddique
(74) *Attorney, Agent, or Firm* — Cooper Legal Group, LLC (57) ABSTRACT

The present disclosure provides a method for detecting a memory and a device for detecting a memory. The memory includes first memory cells, second memory cells, bit lines, complementary bit lines, word lines, and a plurality of sense amplifiers, where each of the sense amplifiers is electrically coupled to a bit line and a complementary bit line; and the method includes: writing storage data into each of the first memory cells and each of the second memory cells; performing a read operation; obtaining a test result based on a difference between real data and the storage data; and obtaining a leakage position of the bit line and the word line or a leakage position the complementary bit line and the word line based on the test result.

14 Claims, 3 Drawing Sheets

(52) U.S. Cl.
CPC .......... *G11C 11/4096* (2013.01); *G11C 29/50* (2013.01); *G11C 29/50016* (2013.01)

(56) References Cited

U.S. PATENT DOCUMENTS

| | | | | |
|---|---|---|---|---|
| 6,330,696 | B1* | 12/2001 | Zorian | G11C 29/02 |
| | | | | 714/719 |
| 6,434,065 | B1* | 8/2002 | Kobayashi | G11C 7/12 |
| | | | | 365/189.11 |
| 6,574,159 | B2 | 6/2003 | Ohbayashi et al. | |
| 6,590,818 | B1 | 7/2003 | Liston et al. | |
| 7,298,659 | B1* | 11/2007 | Kengeri | G11C 29/50016 |
| | | | | 365/201 |
| 7,639,555 | B1* | 12/2009 | Kim | G11C 29/025 |
| | | | | 365/185.23 |
| 2005/0162915 | A1 | 7/2005 | Porter | |
| 2008/0019199 | A1* | 1/2008 | Uchikoba | G11C 29/50016 |
| | | | | 365/201 |

FOREIGN PATENT DOCUMENTS

| | | |
|---|---|---|
| CN | 113012745 A | 6/2021 |
| JP | 2010040664 A | 2/2010 |

OTHER PUBLICATIONS

Written Opinion and English Translation cited in PCT/CN2021/116960 dated Apr. 13, 2022, 7 pages.

* cited by examiner

METHOD FOR DETECTING LEAKAGE POSITION IN MEMORY AND DEVICE FOR DETECTING LEAKAGE POSITION IN MEMORY

CROSS-REFERENCE TO RELATED APPLICATIONS

The present disclosure is a continuation application of International Patent Application No. PCT/CN2021/116960, filed on Sep. 7, 2021, entitled "METHOD FOR DETECTING MEMORY AND DEVICE FOR DETECTING MEMORY", which is based on and claims the priority to Chinese Patent Application No. 202110785259.1, titled "METHOD FOR DETECTING MEMORY AND DEVICE FOR DETECTING MEMORY", and filed on Jul. 12, 2021. The entire contents of International Patent Application No. PCT/CN2021/116960 and Chinese Patent Application No. 202110785259.1 are incorporated herein by reference.

TECHNICAL FIELD

The present disclosure relates to, but is not limited to, a method for detecting a memory and a device for detecting a memory.

BACKGROUND

As a semiconductor memory commonly used in computers, a dynamic random access memory (DRAM) is composed of many repeated memory cells. Each memory cell typically includes a capacitor and a transistor. In the transistor, the gate is connected to the word line, the drain is connected to the bit line, and the source is connected to the capacitor. The voltage signal on the word line controls the transistor to turn on or off, and then the data information stored in the capacitor is read through the bit line, or data information is written into the capacitor through the bit line for storage.

As the DRAM process technology becomes more advanced and the storage density becomes increasingly high, there are more problems in the DRAM process technology, such as: short-circuit caused by the drop of by-products, bit line leakage current, collapse of capacitors, breakage of metal wires, and structural problems caused by substandard critical dimensions. These problems in the process technologies need to be screened out during a yield test process. However, to detect a leakage position in the existing yield test method, different storage data needs to be written into a memory cell twice successively, and the leakage position can be obtained only after two tests, causing a low detection speed.

How to rapidly detect a leakage position during a yield test process is a problem urgently needs to be resolved by those skilled in the art.

SUMMARY

A first aspect of embodiments of the present disclosure provides a method for detecting a memory, the memory includes a plurality of first memory cells, a plurality of second memory cells, a plurality of discrete bit lines, a plurality of discrete complementary bit lines, and a plurality of discrete word lines, where each of the complementary bit lines corresponds to one bit line, the first memory cell is connected to a corresponding bit line and a corresponding word line, and the second memory cell is connected to a corresponding complementary bit line and a corresponding word line; the memory further includes a plurality of sense amplifiers, where each of the sense amplifiers is electrically coupled to one bit line and one complementary bit line; and the detection method includes:

writing storage data into each of the first memory cells and each of the second memory cells, where the storage data in the first memory cell connected to each of the bit lines is the same as the storage data in the second memory cell connected to the complementary bit line corresponding to the bit line;

performing a read operation after the storage data is written, where the read operation includes: strobing all the word lines in sequence for reading, to read real data in each of the first memory cells and each of the second memory cells through the bit line, the complementary bit line, and the sense amplifier;

obtaining a test result based on a difference between the real data and the storage data; and obtaining a leakage position of the bit line and the word line or a leakage position of the complementary bit line and the word line based on the test result corresponding to each of the first memory cells and each of the second memory cells.

A second aspect of the embodiments of the present disclosure provides a device for detecting a memory, where the device for detecting the memory includes:

a memory, where the memory includes a plurality of first memory cells, a plurality of second memory cells, a plurality of discrete bit lines, a plurality of discrete complementary bit lines, and a plurality of discrete word lines, each of the complementary bit lines corresponds to one bit line, the first memory cell is connected to a corresponding bit line and a corresponding word line, and the second memory cell is connected to a corresponding complementary bit line and a corresponding word line; and the memory further includes a plurality of sense amplifiers, and each of the sense amplifiers is electrically coupled to one bit line and one complementary bit line;

a write device, configured to write storage data into the first memory cell and the second memory cell;

a read device, where the read device is configured to strobe all the word lines in sequence for reading, to read real data in each of the first memory cells and each of the second memory cells through the bit line, the complementary bit line, and the sense amplifier;

an instruction device, configured to control the write device to write the same storage data into the first memory cell connected to each of the bit lines and the second memory cell connected to the corresponding complementary bit line; and an error reporting device, where the error reporting device obtains a test result based on a difference between the real data and the storage data, and obtains a leakage position of the bit line and the word line or a leakage position of the complementary bit line and the word line based on the test result corresponding to each of the first memory cells and each of the second memory cells.

BRIEF DESCRIPTION OF THE DRAWINGS

To describe the technical solutions in the embodiments of the present disclosure or in the prior art more clearly, the following briefly describes the accompanying drawings required for describing the embodiments or the prior art. Apparently, the accompanying drawings in the following description show some embodiments of the present disclosure, and those of ordinary skill in the art may still derive other drawings from these accompanying drawings without creative efforts.

One or more embodiments are exemplified by corresponding drawings, and these exemplified descriptions do not constitute a limitation on the embodiments. Components with the same reference numerals in the drawings are denoted as similar components, and the drawings are not limited by scale unless otherwise specified.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

Analysis is provided now with reference to a method for detecting a memory. The memory includes first memory cells and second memory cells, where the first memory cell is a memory cell connected to a bit line, and the second memory cell is a memory cell connected to a complementary bit line. The method includes: writing storage data into each memory cell for the first time, writing first storage data into the first memory cell, and writing second storage data into second memory cell, where the first storage data and the second storage data are different; performing a read operation after the storage data is written, where the read operation includes: strobing all word lines in sequence for reading, to read first real data in each memory cell through the bit line or the complementary bit line and a sense amplifier, and strobing both power cables NCS providing a low potential voltage that correspond to the bit line and the complementary bit line and power cables PCS providing a high potential voltage that correspond to the bit line or the complementary bit line in the sense amplifier before the reading, to raise a higher logic level of logic levels of the bit line and the complementary bit line; obtaining a first test result based on a difference between the first real data and the storage data written for the first time; writing storage data into each memory cell for the second time, writing the second storage data into the first memory cell, and writing the first storage data into the second memory cell; performing the read operation again after the storage data is written for the second time, to read second real data in each memory cell; obtaining a second test result based on a difference between the second real data and the storage data written for the second time; and obtaining a specific position of a bit line leaking electricity based on the second test result and the first test result.

When the bit line and the word line are short circuited, the following four cases may occur during detection: In a first case, the bit line is at a low level. When the bit line is short-circuited to the strobed word line, the bit line changes to a high level, and the read result is that the bit line is at the high level, which is inconsistent with the actual situation. Therefore, a defect is confirmed and thus the specific position of the bit line leaking electricity is detected. In a second case, the bit line is at a high level. When the bit line is short-circuited to the strobed word line, the bit line is still at the high level, and the read result is that the bit line is at the high level, which is consistent with the actual situation. Therefore, no defect can be obtained, and the specific position of the bit line leaking electricity cannot be detected. In a third case, the bit line is at a low level. When the bit line is short-circuited to a word line that is not strobed, the bit line is still at the low level, and the read result is that the bit line is at the low level, which is consistent with the actual situation. Therefore, no defect can be obtained, and the specific position of the bit line leaking electricity cannot be detected. In a fourth case, the bit line is at a high level. When the bit line is short-circuited to a word line that is not strobed, the bit line changes to a low level, and the read result is that the bit line is at the low level, which is inconsistent with the actual situation. Therefore, a defect is confirmed and thus the specific position of the bit line leaking electricity is detected.

In the second case and the third case, no defect can be obtained. However, in the manner of strobing all the word lines in sequence, the second case can be changed to the fourth situation, and the third case can be changed to the first case. In this way, any bit line leakage current case caused by a short circuit between the bit line and the word line can be detected. A case of a short circuit between the complementary bit line and the word line is the same as the case of the short circuit between the bit line and the word line, and details are not described herein again.

It can be learned from the above that, in such a method for detecting a memory, different storage data needs to be written into the memory cells twice, and each time the storage data is written, a specific position of the electricity leakage can be obtained based on two test results only when the storage data of the first memory cell and the storage data of the second memory cell are different, causing a low detection speed, which is not conducive to rapid obtaining of the specific position of the electricity leakage of the memory.

In the method for detecting the memory provided in this embodiment of the present disclosure, the same storage data is written into the first memory cell connected to each bit line and the second memory cell connected to the complementary bit line corresponding to each bit line, and during reading, when neither of the strobed bit line and the corresponding complementary bit line leak electricity, the strobed word line is connected to one of the bit line and the complementary bit line, and a read result is that the one not connected to the strobed word line is at a logic 1 voltage. In this way, when a read logic level of the first memory cell is inconsistent with a preset result, an impact factor is a short-circuit leakage current between a bit line and the strobed word line or a short-circuit leakage current between a corresponding complementary bit line and a word line that is not strobed. When a read logic level of the second memory cell is inconsistent with a preset result, an impact factor is a short-circuit leakage current between a complementary bit line and the strobed word line or a short-circuit leakage current between a corresponding bit line and a word line that is not strobed. All the word lines are strobed in sequence, a specific position of the leakage current can be determined with reference to test results of all first memory cells and all second memory cells connected to a bit line and a corresponding complementary bit line. In such a method, all the word lines are strobed in sequence, and based on a feature used in which the one connected to a strobed word line is at a logic 0 voltage when a bit line and a corresponding complementary bit line are at the same logic level, an accurate position of a leakage current on the bit line or the complementary bit line can be obtained without missing according to a result of one test without comparing test results obtained by respectively writing two logic levels into the first memory cell and the second memory cell, thereby improving detection efficiency of the method for detecting the memory.

Figure 1:
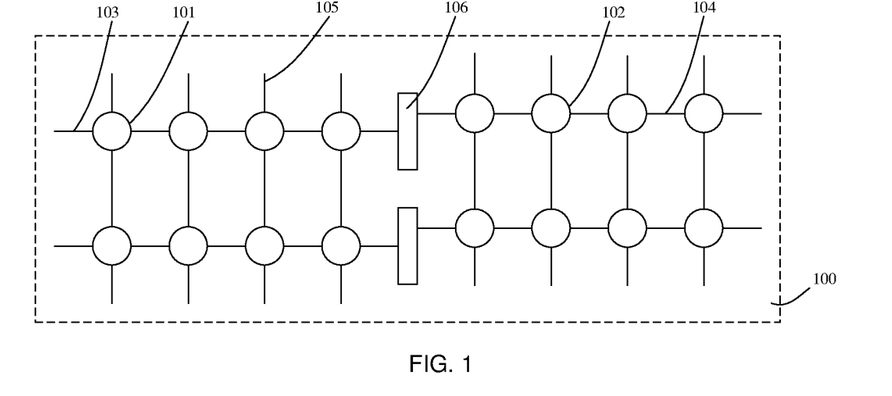
FIG. 1 is a schematic structural diagram of a memory according to an exemplary embodiment.

FIG. 1 is a schematic structural diagram of a memory according to an embodiment of the present disclosure.

The method for detecting a memory provided in this embodiment includes the following content: Referring to FIG. 1, a memory 100 includes a plurality of first memory cells 101, a plurality of second memory cells 102, a plurality of discrete bit lines 103, a plurality of discrete complementary bit lines 104, and a plurality of discrete word lines 105. Each complementary bit line 104 corresponds to one bit line 103, the first memory cell 101 is connected to a corresponding bit line 103 and a corresponding word line 105, and the second memory cell 102 is connected to a corresponding complementary bit line 104 and a corresponding word line 105. The memory 100 further includes a plurality of sense amplifiers 106. Each sense amplifier 106 is electrically coupled to one bit line 103 and one complementary bit line 104.

In this embodiment, the sense amplifier 106 includes a power cable NCS providing a low potential voltage and a power cable PCS providing a high potential voltage.

First, an initialization operation is performed on the first memory cell 101 and the second memory cell 102, to activate the first memory cell 101 and the second memory cell 102. After the initialization operation, a write operation is performed to write storage data into each first memory cell 101 and each second memory cell 102, where storage data in the first memory cell 101 connected to each bit line 103 is the same as storage data in the second memory cell 102 connected to a complementary bit line 104 corresponding to each bit line 103.

The same storage data is written into the first memory cell 101 connected to each bit line 103 and the second memory cell 102 connected to the complementary bit line 104 corresponding to each bit line 103. In this embodiment, for example, a same logic 0 voltage is written. During reading, when neither of a strobed bit line 103 and a corresponding complementary bit line 104 leak electricity, the strobed word line 105 is connected to one of the bit line 103 and the complementary bit line 104, and the read result is that the one not connected to the strobed word line 105 is at a logic 1 voltage. In such a method, all the word lines 105 are strobed in sequence, and based on a feature used in which the one connected to the strobed word line 105 is at the logic 0 voltage when the bit line 103 and the corresponding complementary bit line 104 are at the same logic level, an accurate position of a leakage current on the bit line or the complementary bit line can be obtained without missing according to a result of one test without comparing test results obtained by respectively writing two logic levels into the first memory cell 101 and the second memory cell 102, thereby improving detection efficiency of the method for detecting the memory.

In this embodiment, the manner of writing storage data into the first memory cell 101 and the second memory cell 102 includes: writing the same storage data into all the first memory cells 101 and all the second memory cells 102.

In other embodiments, the manner of writing the storage data into the first memory cell 101 further includes: writing different storage data into a plurality of first memory cells 101 connected to adjacent bit lines 103.

In other embodiments, the manner of writing the storage data into the second memory cell further includes: writing different storage data into a plurality of second memory cells connected to adjacent complementary bit lines.

In this embodiment, the storage data written into each first memory cell 101 and each second memory cell 102 is at a logic 0 voltage. That the storage data written into each first memory cell 101 and each second memory cell 102 is at the logic 0 voltage avoids the possibility that a logic 1 voltage in the memory cell may decrease over time and affect accuracy of the test result. In other embodiments, the storage data written into each first memory cell and each second memory cell may be at a logic 1 voltage.

In this embodiment, after the storage data is written into the first memory cell 101 and the second memory cell 102, an automatic refresh operation may further be performed on all the first memory cells 101 and all the second memory cells 102.

A read operation is performed. The read operation includes: strobing all the word lines 105 in sequence for reading, to read real data in each first memory cell 101 and each second memory cell 102 through the bit line 103, the complementary bit line 104, and the sense amplifier 106. A test result is obtained based on a difference between the real data and the storage data. A Leakage position of the bit line 103 and the word line 105 or a Leakage position of the complementary bit line 104 and the word line 105 is obtained based on the test result corresponding to each first memory cell 101 and each second memory cell 102.

In this embodiment, both power cables NCS providing a low potential voltage that correspond to the bit line 103 and the complementary bit line 104 and power cables PCS providing a high potential voltage that correspond to the bit line 103 and the complementary bit line 104 are strobed before the reading, to raise a higher logic level of logic levels of the bit line 103 and the complementary bit line 104; and then an automatic refresh operation may be performed on all the first memory cells 101 and all the second memory cells 102.

It should be noted that, when the logic 0 voltage is written into both the first memory cell 101 connected to each bit line 103 and the second memory cell 102 connected to the complementary bit line 104 corresponding to each bit line 103, during reading, when neither of a strobed bit line 103 and a corresponding complementary bit line 104 leak electricity, the strobed word line 105 is connected to one of the bit line 103 and the complementary bit line 104, and the read result is that the one not connected to the strobed word line 105 is at a logic 1 voltage.

Various different types of logic level changes of the bit line 103 and the complementary bit line 104 during detection are described in detail below with reference to the accompanying drawings. The storage data written into each first memory cell 101 and each second memory cell 102 is at a logic 0 voltage, and all the word lines are strobed in sequence for reading.

Figure 2:
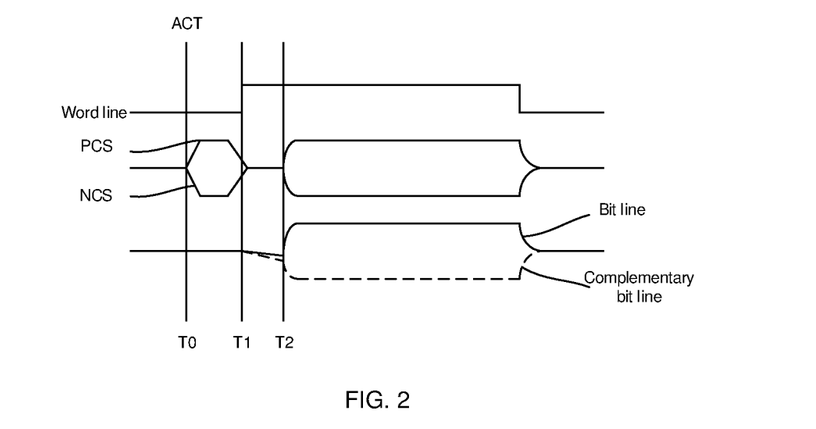
FIG. 2 is a schematic diagram of a first type of logic level change of a bit line and a corresponding complementary bit line according to an exemplary embodiment.
Figure 3:
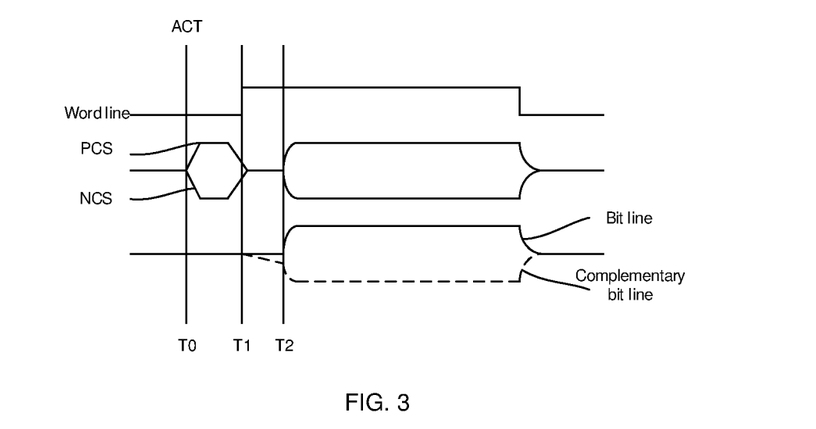
FIG. 3 is a schematic diagram of a second type of logic level change of a bit line and a corresponding complementary bit line according to an exemplary embodiment.
Figure 4:
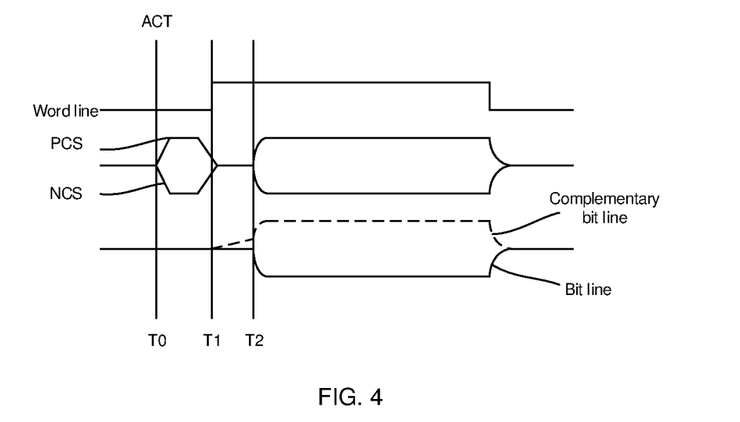
FIG. 4 is a schematic diagram of a third type of logic level change of a bit line and a corresponding complementary bit line according to an exemplary embodiment.

In a first case, a short circuit between a complementary bit line 104 and a word line 105 causes a leakage current of a second memory cell 102. With reference to FIG. 2 to FIG. 4, in this case, there are three types of logic level changes of the bit line 103 and the complementary bit line 104.

FIG. 2 is a schematic diagram of a first type of logic level change of a bit line and a corresponding complementary bit line according to an embodiment of the present disclosure.

Referring to FIG. 2, for the first type, when a first memory cell 101 corresponding to a second memory cell 102 leaking electricity is strobed, an activate operation ACT is performed at a time node TO; after the activate operation ACT, precharge processing is performed on the power cable NCS providing the low potential voltage and the power cable PCS providing the high potential voltage, and after the precharge processing, the power cable NCS providing the low potential voltage and the power cable PCS providing the high potential voltage are at a same voltage level. The strobed bit line 103 and the corresponding complementary bit line 104 enter a charge sharing stage, the bit line 103 and the corresponding complementary bit line 104 are precharged, and the precharged bit line 103 and the precharged corresponding complementary bit line 104 are at a same voltage level. A word line 105 connected to the first memory cell 101 is strobed at the time node T1. Within a time period from T1 to T2, because the strobed word line 105 is connected to the bit line 103, the level of the bit line 103 drops slightly. However, because the complementary bit line 104 is short-circuited to a word line 105 that is not strobed, the level of the complementary bit line 104 drops to a low level. At the time node T2, the sense amplifier is turned on, and the power cables NCS providing the low potential voltage that correspond to the bit line 103 and the complementary bit line 104 and the power cables PCS providing the high potential voltage that correspond to the bit line 103 and the complementary bit line 104 are strobed, to raise a higher level of the levels of the bit line 103 and the complementary bit line 104. Because the level of the complementary bit line 104 is lower than the level of the bit line 103, a read level of the bit line 103 is a high level, which is inconsistent with a low level of the bit line 103 that should be read. All first memory cells 101 corresponding to the second memory cell 102 leaking electricity are strobed in sequence, and the read result is the same as that in FIG. 2.

A case of strobing another second memory cell 102 connected to the same complementary bit line 104 as the second memory cell 102 leaking electricity is described in detail below. For parts that are the same as those in the case of strobing the first memory cell 101, details are not described again.

FIG. 3 is a schematic diagram of a second type of logic level change of a bit line and a corresponding complementary bit line according to an embodiment of the present disclosure.

Referring to FIG. 3, for the second type, when another second memory cell 102 connected to the same complementary bit line 104 as the second memory cell 102 leaking electricity is strobed, because the strobed word line 105 is connected to the complementary bit line 104, the level of the complementary bit line 104 drops slightly, the level of the bit line 103 remains unchanged, and a level to be read of the complementary bit line 104 is a low level. In fact, because the complementary bit line 104 is short-circuited to the word line 105 not strobed, the level of the complementary bit line 104 drops to the low level, and the read level of the complementary bit line 104 is also the low level, which is consistent with the actual situation.

All other second memory cells 102 connected to the same complementary bit line 104 as the second memory cell 102 leaking electricity are strobed in sequence, and the read result is consistent with that in FIG. 3.

A case of strobing the second memory cell 102 leaking electricity is described in detail below. For parts that are the same as those in the case of strobing the first memory cell 101, details are not described again.

FIG. 4 is a schematic diagram of a third type of logic level change of a bit line and a corresponding complementary bit line according to an embodiment of the present disclosure.

Referring to FIG. 4, for the third type, when the second memory cell 102 leaking electricity is strobed, the level of the bit line 103 remains unchanged, the level of the complementary bit line 104 is pulled to a high level by the strobed word line 105, and the read result is that the level of the complementary bit line 104 is a high level, which is inconsistent with a result to be actually read.

In summary, a first case of a short circuit of the bit line 103 or the complementary bit line 104 is analyzed according to the three types of logic level changes of the bit line 103 and the complementary bit line 104: In the first type, there are two reasons for the incorrect read level of the bit line 103: First, the strobed first memory cell 101 is short-circuited; second, at least one of all the second memory cells 102 connected to the corresponding complementary bit line 104 is short-circuited. It is first assumed that none of the second memory cells 102 connected to the corresponding complementary bit line 104 are short-circuited. The assumption is verified with reference to a second case and a third case, and results of all the second memory cells 102 strobed in sequence and connected to the complementary bit line 104 are analyzed. In the third case, there is a second memory cell 102 whose level is read to be the high level of the complementary bit line 104, and the read result is inconsistent with a preset result without any short circuit. In the second case, a read result of another second memory cell 102 is a low level of the complementary bit line 104, and the read result is consistent with the preset result without any short circuit. Therefore, it can be determined that the assumption is not valid, that is, at least one of all the second memory cells 102 connected to the corresponding complementary bit line 104 is short-circuited, and according to the result, it can be determined that the leakage position is the second memory cell 102 connected in the third case.

In summary, it can be obtained that, storage data in all first memory cells 101 connected to the same bit line 103 is different with the real data, and storage data in the only second memory cell 102 which connected to a corresponding complementary bit line 104 is different with the real data, and the test result is that the leakage state between the complementary bit line 104 and the word line 105 connected to the only second memory cell 102 is abnormal.

Figure 5:
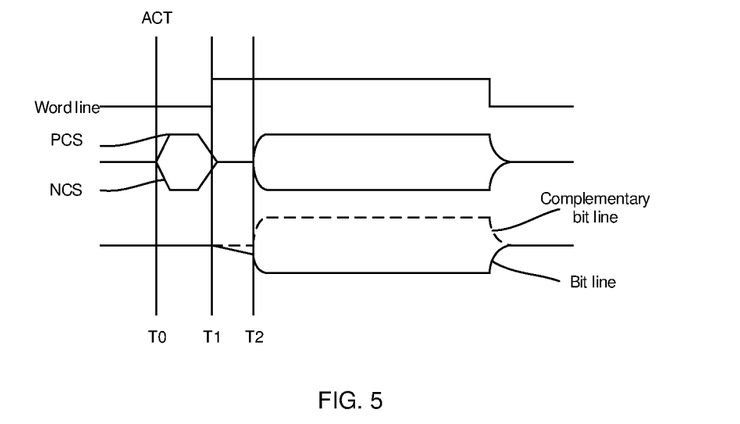
FIG. 5 is a schematic diagram of a fourth type of logic level change of a bit line and a corresponding complementary bit line according to an exemplary embodiment.
Figure 6:
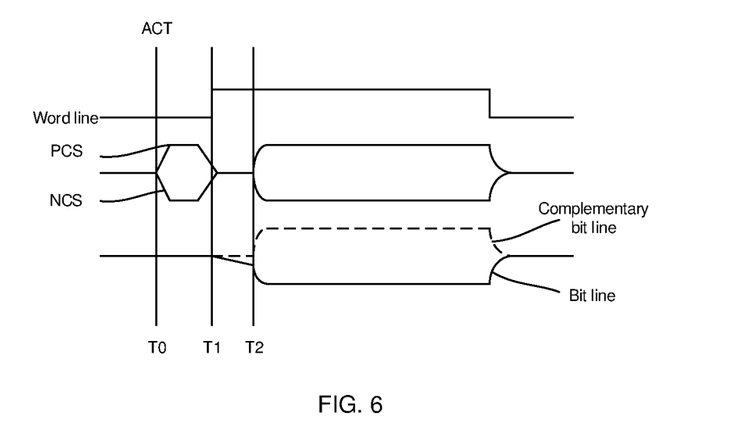
FIG. 6 is a schematic diagram of a fifth type of logic level change of a bit line and a corresponding complementary bit line according to an exemplary embodiment.
Figure 7:
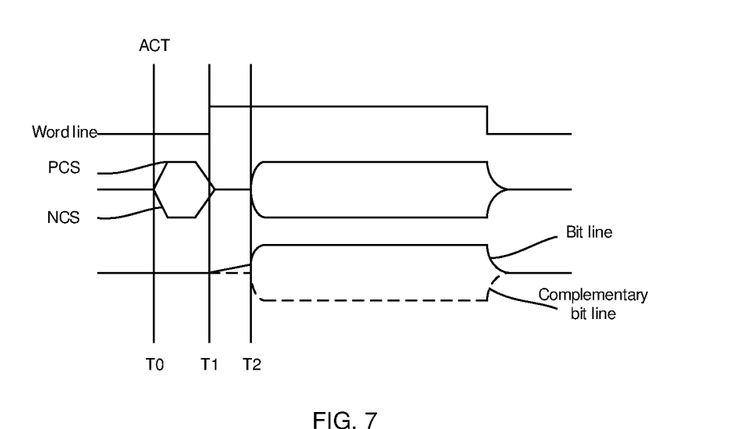
FIG. 7 is a schematic diagram of a sixth type of logic level change a bit line and a corresponding complementary bit line according to an exemplary embodiment.

Next, a second case of the short circuit of the bit line 103 or the complementary bit line 104 and a case of a leakage current of a first memory cell 101 caused by a short circuit between a bit line 103 and a word line 105 is described in detail. With reference to FIG. 5 to FIG. 7, in this case, there are also three types of logic level changes of the bit line 103 and the complementary bit line 104.

FIG. 5 is a schematic diagram of a fourth type of logic level change of a bit line and a corresponding complementary bit line according to an embodiment of the present disclosure.

Referring to FIG. 5, for the first type, when a second memory cell 102 corresponding to a first memory cell 101 leaking electricity is strobed, an activate operation ACT is performed at a time node T0; after the activate operation ACT, precharge processing is performed on the power cable NCS providing the low potential voltage and the power cable PCS providing the high potential voltage, and after the precharge processing, the power cable NCS providing the low potential voltage and the power cable PCS providing the high potential voltage are at a same level. The strobed bit line 103 and the corresponding complementary bit line 104 enter a charge sharing stage, the bit line 103 and the corresponding complementary bit line 104 are precharged, and the precharged bit line 103 and the precharged corresponding complementary bit line 104 are at a same voltage level. A word line 105 connected to the second memory cell 102 is strobed at the time node T1. Within a time period from T1 to T2, because the strobed word line 105 is connected to the complementary bit line 104, the level of the complementary bit line 104 drops slightly. However, because the bit line 103 is short-circuited to a word line 105 that is not strobed, the level of the bit line 103 drops to a low level. At the time node T2, the sense amplifier is turned on, and the power cables NCS providing the low potential voltage that correspond to the bit line 103 and the complementary bit line 104 and the power cables PCS providing the high potential voltage that correspond to the bit line 103 and the complementary bit line 104 are strobed, to raise a higher level of the levels of the bit line 103 and the complementary bit line 104. Because the level of the bit line 103 is lower than the level of the complementary bit line 104, a read level of the complementary bit line 104 is a high level, which is inconsistent with a low level of the complementary bit line 104 that should be read. All second memory cells 102 corresponding to the first memory cell 101 leaking electricity are strobed in sequence, and the read result is the same as that in FIG. 5.

A case of strobing another first memory cell 101 connected to the same bit line 103 as the first memory cell 101 leaking electricity is described in detail below. For parts that are the same as those in the case of strobing the second memory cell 102, details are not described again.

FIG. 6 is a schematic diagram of a fifth type of logic level change of a bit line and a corresponding complementary bit line according to an embodiment of the present disclosure.

Referring to FIG. 6, for the second type, when another first memory cell 101 connected to the same bit line 103 as the first memory cell 101 leaking electricity is strobed, because the strobed word line 105 is connected to the bit line 103, the level of the bit line 103 drops slightly, the level of the complementary bit line 104 remains unchanged, and a level to be read of the bit line 103 is a low level. In fact, because the bit line 103 is short-circuited to the word line 105 not strobed, the level of the bit line 103 drops to the low level, and the read level of the bit line 103 is also the low level, which is consistent with the actual situation.

All other first memory cells 101 connected to the same bit line 103 as the first memory cell 101 leaking electricity are strobed in sequence, and the read result is consistent with that in FIG. 6.

A case of strobing the first memory cell 101 leaking electricity is described in detail below. For parts that are the same as those in the case of strobing the second memory cell 102, details are not described again.

FIG. 7 is a schematic diagram of a sixth type of logic level change of a bit line and a corresponding complementary bit line according to an embodiment of the present disclosure.

Referring to FIG. 7, for the third type, when the first memory cell 101 leaking electricity is strobed, the level of the complementary bit line 104 remains unchanged, the level of the bit line 103 is pulled to a high level by the strobed word line 105, and the read result is that the level of the bit line 103 is a high level, which is inconsistent with a result to be actually read.

In summary, a second case of a short circuit of the bit line 103 or the complementary bit line 104 is analyzed according to the three types of logic level changes of the bit line 103 and the complementary bit line 104: In the first type, there are two reasons for the incorrect read level of the complementary bit line 104: First, the strobed second memory cell 102 is short-circuited; second, at least one of all the first memory cells 101 connected to the corresponding bit line 103 is short-circuited. It is first assumed that none of the first memory cells 101 connected to the corresponding bit line 103 are short-circuited. The assumption is verified with reference to a second case and a third case, and results of all the first memory cells 101 strobed in sequence and connected to the bit line 103 are analyzed. In the third case, there is a first memory cell 101 whose level is read to be the high level of the bit line 103, and the read result is inconsistent with a preset result without any short circuit. In the second case, a read result of another first memory cell 101 is a low level of the bit line 103, and the read result is consistent with the preset result without any short circuit. Therefore, it can be determined that the assumption is not valid, that is, at least one of all the first memory cells 101 connected to the corresponding bit line 103 is short-circuited, and according to the result, it can be determined that the leakage position is the first memory cell 101 connected in the third case.

In summary, it can be obtained that, storage data in all second memory cells 102 connected to the same complementary bit line 104 is different with the real data, and storage data in the only first memory cell 101 which connected to a corresponding bit line 103 is different with the real data, and the test result is that the leakage state between the bit line 103 and the word line 105 connected to the only first memory cell 101 is abnormal.

In the method for detecting the memory provided in this embodiment, the same storage data is written into the first memory cell 101 connected to each bit line 103 and the second memory cell 102 connected to the complementary bit line 104 corresponding to each bit line 103, and during reading, when neither of the strobed bit line 103 and the corresponding complementary bit line 104 leak electricity, the strobed word line 105 is connected to one of the bit line 103 and the complementary bit line 104, and a read result is that the one not connected to the strobed word line 105 is at a logic 1 voltage. In this way, when a read logic level of the first memory cell 101 is inconsistent with a preset result, an impact factor is a short-circuit leakage current between a bit line 103 and the strobed word line 105 or a short-circuit leakage current between a corresponding complementary bit line 104 and a word line 105 that is not strobed. When a read logic level of the second memory cell 102 is inconsistent with a preset result, an impact factor is a short-circuit leakage current between a complementary bit line 104 and the strobed word line 105 or a short-circuit leakage current between a corresponding bit line 103 and a word line 105 that is not strobed. All the word lines 105 are strobed in sequence, a specific position of the leakage current can be determined with reference to test results of all first memory cells 101 and all second memory cells 102 connected to a bit line 103 and a corresponding complementary bit line 104. In such a method, all the word lines 105 are strobed in sequence, and based on a feature used in which the one connected to a strobed word line 105 is at a logic 0 voltage when a bit line 103 and a corresponding complementary bit line 104 are at the same logic level, an accurate position of a leakage current on the bit line 103 or the complementary bit line 104 can be obtained without missing according to a result of one test without comparing test results obtained by respectively writing two logic levels into the first memory cell 101 and the second memory cell 102, thereby improving detection efficiency of the method for detecting the memory.

Another embodiment of the present disclosure provides a device for detecting a memory corresponding to the method for detecting a memory in the foregoing embodiment. The device for detecting a memory of this embodiment is described in detail below with reference to the drawings.

Referring to the memory 100 in FIG. 1, the memory 100 includes a plurality of first memory cells 101, a plurality of second memory cells 102, a plurality of discrete bit lines 103, a plurality of discrete complementary bit lines 104, and a plurality of discrete word lines 105. Each complementary bit line 104 corresponds to one bit line 103, the first memory cell 101 is connected to a corresponding bit line 103 and a corresponding word line 105, and the second memory cell 102 is connected to a corresponding complementary bit line 104 and a corresponding word line 105. The memory 100 further includes a plurality of sense amplifiers 106. Each sense amplifier 106 is electrically coupled to one bit line 103 and one complementary bit line 104.

Figure 8:
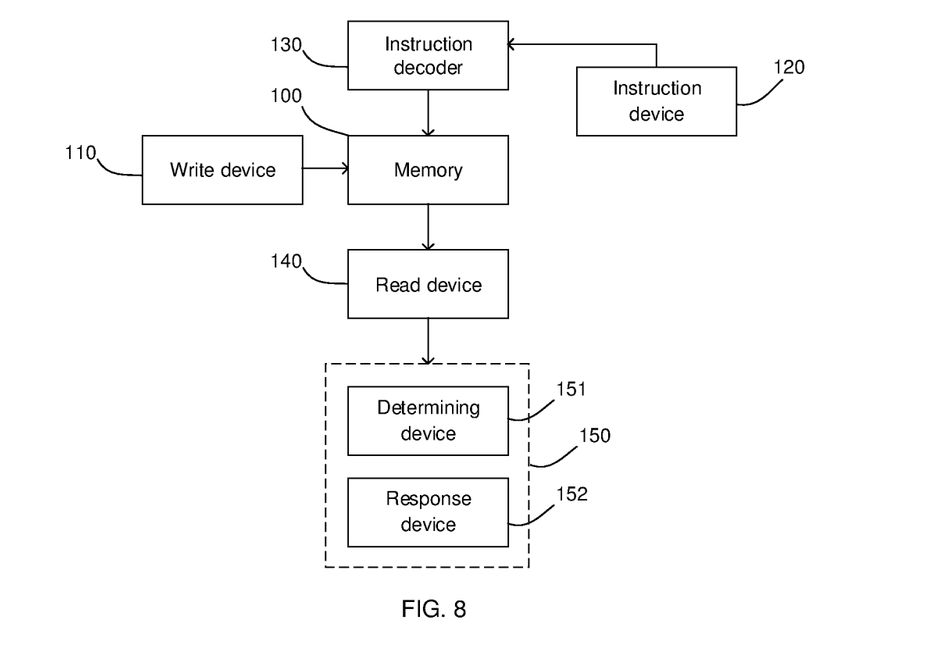
FIG. 8 is a schematic diagram of modules of a device for detecting a memory according to an exemplary embodiment.

FIG. 8 is a schematic diagram of modules of a device for detecting a memory according to still another embodiment of the present disclosure.

Referring to FIG. 1 and FIG. 8, the device includes: a write device 110, configured to write storage data into the first memory cell 101 and the second memory cell 102; a read device 140, where the read device 140 is configured to strobe all the word lines 105 in sequence for reading, to read real data in each first memory cell 101 and each second memory cell 102 through the bit line 103, the complementary bit line 104, and the sense amplifier 106; an instruction device 120, configured to control the write device 110 to write the same storage data into the first memory cell 101 connected to each bit line 103 and the second memory cell 102 connected to the corresponding complementary bit line 104; and an error reporting device 150, where the error reporting device 150 obtains a test result based on a difference between the real data and the storage data, and obtains leakage positions of the bit line 103 or the complementary bit line 104 and the word line 105 based on the test result corresponding to each first memory cell 101 and each second memory cell 102.

In this embodiment, the error reporting device 150 includes a determining device 151. The determining device 151 is configured to determine the leakage position of the bit line 103 or the leakage position of the complementary bit line 104 and the word line 105 according to the test result. The error reporting device 150 further includes a response device 152, configured to make a response according to a determining result of the determining device 151.

In this embodiment, the device for detecting the memory further includes: a precharging device, where the precharging device is configured to precharge the bit line 103 and the corresponding complementary bit line 104, such that after a word line 105 is strobed, the precharged bit line 103 and the precharged corresponding complementary bit line 104 are at a same voltage level.

The device for detecting the memory further includes: an automatic refresh device, configured to perform an automatic refresh operation on the first memory cell 101 and the second memory cell 102 at regular intervals.

In this embodiment, the device further includes: an instruction decoder 130, configured to adjust, according to an instruction sent by the instruction device 120, types of the storage data written into the first memory cell 101 and the second memory cell 102 by the write device 110.

In the device for detecting the memory provided in this embodiment, the same storage data is written into the first memory cell 101 connected to each bit line 103 and the second memory cell 102 connected to the complementary bit line 104 corresponding to each bit line 103. In this way, when a read logic level of the first memory cell 101 is inconsistent with a preset result, an impact factor is a short-circuit leakage current between a bit line 103 and the strobed word line 105 or a short-circuit leakage current between a corresponding complementary bit line 104 and a word line 105 that is not strobed. When a read logic level of the second memory cell 102 is inconsistent with a preset result, an impact factor is a short-circuit leakage current between a complementary bit line 104 and the strobed word line 105 or a short-circuit leakage current between a corresponding bit line 103 and a word line 105 that is not strobed. All the word lines 105 are strobed in sequence, a specific position of the leakage current can be determined with reference to test results of all first memory cells 101 and all second memory cells 102 connected to a bit line 103 and a corresponding complementary bit line 104. In such a method, all the word lines 105 are strobed in sequence, and based on a feature used in which the one connected to a strobed word line 105 is at a logic 0 voltage when a bit line 103 and a corresponding complementary bit line 104 are at the same logic level, an accurate position of a leakage current on the bit line 103 or the complementary bit line 104 can be obtained without missing according to a result of one test without comparing test results obtained by respectively writing two logic levels into the first memory cell 101 and the second memory cell 102, thereby improving detection efficiency of the method for detecting the memory.

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an illustrative embodiment", "some implementations", "an illustrative implementation" and "an example" means that the specific feature, structure, material or feature described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned device or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the method and the device for detecting the memory disclosed in the embodiments of the present disclosure, the same storage data is written into the first memory cell connected to each bit line and the second memory cell connected to the complementary bit line corresponding to each bit line, and during reading, when neither of the strobed bit line and the corresponding complementary bit line leak electricity, the strobed word line is connected to one of the bit line and the complementary bit line, and a read result is that the one not connected to the strobed word line is at a logic high level. In this way, when a read logic level of the first memory cell is inconsistent with a preset result, an impact factor is a short-circuit leakage current between a bit line and the strobed word line or a short-circuit leakage current between a corresponding complementary bit line and a word line that is not strobed. When a read logic level of the second memory cell is inconsistent with a preset result, an impact factor is a short-circuit leakage current between a complementary bit line and the strobed word line or a short-circuit leakage current between a corresponding bit line and a word line that is not strobed. All the word lines are strobed in sequence, a specific position of the leakage current can be determined with reference to test results of all first memory cells and all second memory cells connected to a bit line and a corresponding complementary bit line. In such a method, all the word lines are strobed in sequence, and based on a feature used in which the one connected to a strobed word line is at a logic low level when a bit line and a corresponding complementary bit line are at the same logic level, an accurate position of a leakage current on the bit line or the complementary bit line can be obtained without missing according to a result of one test without comparing test results obtained by respectively writing two logic levels into the first memory cell and the second memory cell, thereby improving detection efficiency of the method for detecting the memory.

In addition, the storage data written into each first memory cell and each second memory cell is at a logic 0 voltage, thereby avoiding the possibility that a logic 1 voltage in the memory cell may decrease over time and affect accuracy of the test result.

In addition, the bit line and the corresponding complementary bit line are precharged, and the precharged bit line and the precharged corresponding complementary bit line are at a same voltage level, thereby preventing other factors from affecting a higher level of levels of the bit line and the corresponding complementary bit line selected by the sense amplifier, ensuring that a detected potential status fully reflects a status of the memory, and helping improve detection accuracy.

The invention claimed is:

1. A method for detecting a leakage position in a memory, wherein
the memory comprises a plurality of first memory cells, a plurality of second memory cells, a plurality of discrete bit lines, a plurality of discrete complementary bit lines, and a plurality of discrete word lines, wherein each of the complementary bit lines corresponds to one bit line, the first memory cell is connected to a corresponding bit line and a corresponding word line, and the second memory cell is connected to a corresponding complementary bit line and a corresponding word line; the memory further comprises a plurality of sense amplifiers, wherein each of the sense amplifiers is electrically coupled to one bit line and one complementary bit line; and the method comprises:
writing storage data into each of the first memory cells and each of the second memory cells, wherein the storage data in the first memory cell connected to each of the bit lines is the same as the storage data in the second memory cell connected to the complementary bit line corresponding to the bit line;
performing a read operation after the storage data is written, wherein the read operation comprises: strobing all the word lines in sequence for reading, to read real data in each of the first memory cells and each of the second memory cells through the bit line, the complementary bit line, and the sense amplifier;
obtaining a test result based on a difference between the real data and the storage data; and
obtaining a leakage position of the bit line and the word line or a leakage position of the complementary bit line and the word line based on the test result corresponding to each of the first memory cells and each of the second memory cells;
wherein in the step of the obtaining a leakage position of the bit line and the word line or a leakage position of the complementary bit line and the word line based on the test result corresponding to each of the first memory cells and each of the second memory cells, the method comprises:

the storage data in all second memory cells connected to the same complementary bit line is different than the real data, the storage data in the only first memory cell which connected to a corresponding bit line is different than the real data, and the test result is that a leakage state between the bit line and the word line connected to the only first memory cell is abnormal.

2. The method for detecting a leakage position in a memory according to claim 1, wherein a manner of the writing storage data into each of the first memory cells and each of the second memory cells comprises: writing the same storage data into all the first memory cells and all the second memory cells.

3. The method for detecting a leakage position in a memory according to claim 2, wherein the storage data written into each of the first memory cells and each of the second memory cells is a logic 0 voltage.

4. The method for detecting a leakage position in a memory according to claim 1, wherein a manner of writing the storage data into the first memory cell comprises: writing different storage data into a plurality of first memory cells which are connected to the adjacent bit lines.

5. The method for detecting a leakage position in a memory according to claim 1, wherein a manner of writing the storage data into the second memory cell comprises: writing different storage data into a plurality of second memory cells which are connected to adjacent the complementary bit lines.

6. The method for detecting a leakage position in a memory according to claim 1, wherein after strobing the word line, the method further comprises: precharging the bit line and the corresponding complementary bit line, wherein the precharged bit line and the precharged corresponding complementary bit line are at a same voltage level.

7. The method for detecting a leakage position in a memory according to claim 1, wherein before the read operation is performed, the method further comprises: performing an automatic refresh operation on all the first memory cells and all the second memory cells.

8. The method for detecting a leakage position in a memory according to claim 1, wherein before writing the storage data into each of the first memory cells and each of the second memory cells, the method further comprises: performing an initialization operation on the first memory cell and the second memory cell, to activate the first memory cell and the second memory cell.

9. The method for detecting a leakage position in a memory according to claim 1, wherein in the step of the obtaining a leakage position of the bit line and the word line or a leakage position of the complementary bit line and the word line based on the test result corresponding to each of the first memory cells and each of the second memory cells, the method comprises:

the storage data in all first memory cells connected to the same bit line is different than the real data, the storage data in the only second memory cell which connected to a corresponding complementary bit line is different than the real data, and the test result is that a leakage state between the complementary bit line and the word line connected to the only second memory cell is abnormal.

10. A device for detecting a leakage position in a memory, comprising:

a memory, wherein the memory comprises a plurality of first memory cells, a plurality of second memory cells, a plurality of discrete bit lines, a plurality of discrete complementary bit lines, a plurality of discrete word lines, and a plurality of sense amplifiers, each of the complementary bit lines corresponds to one bit line, the first memory cell is connected to a corresponding bit line and a corresponding word line, the second memory cell is connected to a corresponding complementary bit line and a corresponding word line, and each of the sense amplifiers is electrically coupled to one bit line and one complementary bit line;

a write device, configured to write storage data into the first memory cell and the second memory cell;

a read device, wherein the read device is configured to strobe all the word lines in sequence for reading, to read real data in each of the first memory cells and each of the second memory cells through the bit line, the complementary bit line, and the sense amplifier;

an instruction device, configured to control the write device to write the same storage data into the first memory cell connected to each of the bit lines and the second memory cell connected to the corresponding complementary bit line; and an error reporting device, wherein the error reporting device obtains a test result based on a difference between the real data and the storage data, and obtains a leakage position of the bit line and the word line or a leakage position of the complementary bit line and the word line based on the test result corresponding to each of the first memory cells and each of the second memory cells;

wherein obtaining the leakage position of the bit line and the word line or the leakage position of the complementary bit line and the word line based on the test result corresponding to each of the first memory cells and each of the second memory cells comprises:

the storage data in all second memory cells connected to the same complementary bit line is different than the real data, the storage data in the only first memory cell which connected to a corresponding bit line is different than the real data, and the test result is that a leakage state between the bit line and the word line connected to the only first memory cell is abnormal.

11. The device for detecting a leakage position in a memory according to claim 10, wherein the device for detecting the leakage position in the memory further comprises: an instruction decoder, configured to adjust, according to an instruction sent by the instruction device, types of the storage data written into the first memory cell and the second memory cell by the write device.

12. The device for detecting a leakage position in a memory according to claim 10, wherein the device for detecting the leakage position in the memory further comprises: a precharging device, wherein the precharging device is configured to precharge the bit line and the corresponding complementary bit line, such that after a word line is strobed, the precharged bit line and the precharged corresponding complementary bit line are at a same voltage level.

13. The device for detecting a leakage position in a memory according to claim 10, wherein the device for detecting the leakage position in the memory further comprises: an automatic refresh device, configured to perform an automatic refresh operation on the first memory cell and the second memory cell at regular intervals.

14. The device for detecting a leakage position in a memory according to claim 10, wherein the error reporting device comprises a determining device, wherein the determining device is configured to determine the leakage position of the bit line and the word line or the leakage position of the complementary bit line and the word line according to the test result.

* * * * *